US012628558B2

(12) United States Patent
Kim

(10) Patent No.: US 12,628,558 B2
(45) Date of Patent: May 12, 2026

(54) THERMOELECTRIC MODULE

(71) Applicant: LG INNOTEK CO., LTD., Seoul (KR)

(72) Inventor: Jong Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 36 days.

(21) Appl. No.: 18/729,256

(22) PCT Filed: Feb. 3, 2023

(86) PCT No.: PCT/KR2023/001571
§ 371 (c)(1),
(2) Date: Jul. 16, 2024

(87) PCT Pub. No.: WO2023/149743
PCT Pub. Date: Aug. 10, 2023

(65) Prior Publication Data
US 2024/0397824 A1 Nov. 28, 2024

(30) Foreign Application Priority Data
Feb. 3, 2022 (KR) ........................ 10-2022-0014204

(51) Int. Cl.
*H10N 10/13* (2023.01)
*H10N 10/17* (2023.01)
(52) U.S. Cl.
CPC ............. *H10N 10/13* (2023.02); *H10N 10/17* (2023.02)
(58) Field of Classification Search
CPC .............................. H10N 10/13; H10N 10/17
See application file for complete search history.

(56) References Cited

U.S. PATENT DOCUMENTS 8,371,367 B2 2/2013 Chiba et al.

FOREIGN PATENT DOCUMENTS

| CN | 212901419 | 4/2021 | |
| JP | 2006-080326 | 3/2006 | |
| KR | 10-0984112 | 9/2010 | |
| KR | 10-2170479 | 10/2020 | |
| KR | 10-2021-0088978 | 7/2021 | |
| WO | WO-2021045516 A1 * | 3/2021 | ............ H10N 10/17 |

OTHER PUBLICATIONS

International Search Report dated May 19, 2023 issued in Application No. PCT/KR2023/001571.
Korean Office Action dated Jun. 9, 2025 issued in Application No. 10-2022-0014204.

* cited by examiner

*Primary Examiner* — Tae-Sik Kang
(74) *Attorney, Agent, or Firm* — KED & ASSOCIATES

(57) ABSTRACT

A thermoelectric module according to one embodiment of the present invention comprises: a first substrate; a first electrode disposed on the first substrate; a semiconductor structure disposed on the first electrode; a second electrode disposed on the semiconductor structure; a second substrate disposed on the second electrode; and a heat sink disposed on the second substrate, wherein the heat sink includes, on the surface thereof, a plurality of grooves extending in a first direction through which fluid passes, the plurality of grooves have the same first width in the direction parallel to the surface of the heat sink and perpendicular to the first direction and have the same depth in the direction perpendicular to the surface of the heat sink, and the first width is 1 to 10 μm and the depth is 1 to 10 μm.

20 Claims, 16 Drawing Sheets

FIRST DIRECTION

THIRD DIRECTION

SECOND DIRECTION

1400

1800

1700

1300

1100

1200

1700

1800

1400

FIRST DIRECTION

THIRD DIRECTION

SECOND DIRECTION

THIRD DIRECTION

FIRST DIRECTION     SECOND DIRECTION

THIRD DIRECTION

FIRST DIRECTION     SECOND DIRECTION (a)                (b)

THIRD DIRECTION

SECOND DIRECTION

FIRST DIRECTION

THIRD DIRECTION

FIRST DIRECTION          SECOND DIRECTION

THIRD DIRECTION

SECOND DIRECTION

FIRST DIRECTION (a)

(b)

FIRST DIRECTION

THIRD DIRECTION

SECOND DIRECTION
FIRST DIRECTION

THERMOELECTRIC MODULE

CROSS-REFERENCE TO RELATED PATENT APPLICATIONS

This application is a U.S. National Stage Application under 35 U.S.C. § 371 of PCT Application No. PCT/KR2023/001571, filed Feb. 3, 2023, which claims priority to Korean Patent Application No. 10-2022-0014204, filed Feb. 3, 2022, whose entire disclosures are hereby incorporated by reference.

TECHNICAL FIELD

The present invention relates to a thermoelectric module, and more specifically, to a heat sink of a thermoelectric element.

BACKGROUND ART

A thermoelectric phenomenon is a phenomenon caused by the movement of electrons and holes inside a material and means direct energy conversion between heat and electricity.

A thermoelectric element is a general term for an element using the thermoelectric phenomenon and has a structure in which a P-type thermoelectric material and an N-type thermoelectric material are bonded between metal electrodes to form a pair of a PN junction.

Thermoelectric elements may be classified into elements using a temperature change in electrical resistance, elements using the Seebeck effect, which is a phenomenon in which an electromotive force is generated due to a temperature difference, elements using the Peltier effect, which is a phenomenon in which heat absorption or heat generation occurs due to a current, and the like.

Thermoelectric elements are widely applied to home appliances, electronic components, communication components, and the like. For example, the thermoelectric elements may be applied to cooling devices, heating devices, power generation devices, and the like. Therefore, the demand for the thermoelectric performance of the thermoelectric element is gradually increasing.

The thermoelectric element includes a substrate, an electrode, and a thermoelectric leg, the thermoelectric leg is disposed between an upper substrate and a lower substrate, an upper electrode is disposed between the thermoelectric leg and the upper substrate, and a lower electrode is between the thermoelectric leg and the lower substrate.

Meanwhile, a heat sink is disposed on at least one of the upper substrate and the lower substrate of the thermoelectric element, and a fluid may pass through the heat sink. When the fluid passing through the heat sink is exhaust gas, fine particles generated by incomplete combustion in the exhaust gas may be adsorbed on a surface of the heat sink. When the fine particles are accumulated and adsorbed on the surface of the heat sink, a flow path of the fluid passing through the heat sink is blocked, the heat exchange performance of the heat sink is reduced, or heat is accumulated in the heat sink, increasing the risk of fire.

DISCLOSURE

Technical Problem

The present invention is directed to providing a thermoelectric module with improved heat exchange performance between heat sinks.

Technical Solution

A thermoelectric module according to one embodiment of the present invention includes a first substrate, a first electrode disposed on the first substrate, a semiconductor structure disposed on the first electrode, a second electrode disposed on the semiconductor structure, a second substrate disposed on the second electrode, and a heat sink disposed on the second substrate, wherein a surface of the heat sink includes a plurality of grooves extending in a first direction in which a fluid passes, the plurality of grooves have the same first width in a direction parallel to the surface of the heat sink and perpendicular to the first direction and have the same depth in a direction perpendicular to the surface of the heat sink, and the first width is in the range of 1 to 10 μm, and the depth is in the range of 1 to 10 μm.

The heat sink may include a first surface disposed on the second substrate, a second surface connected to the first surface and disposed in a direction perpendicular to the second substrate, a third surface connected to the second surface and disposed to face the second substrate, and a fourth surface connected to the third surface and disposed perpendicular to the second substrate and to face the second surface, a distance between the second substrate and the third surface may be greater than a distance between the second substrate and the first surface, the first surface, the second surface, the third surface, and the fourth surface each extend in the first direction, the first surface, the second surface, the third surface, and the fourth surface may be connected by being sequentially repeated multiple times, and the plurality of grooves may be disposed in the first surface, the second surface, the third surface, and the fourth surface.

The plurality of grooves may be formed in a surface opposite to a surface facing the second substrate of both surfaces of the first surface, both surfaces of the second surface, both surfaces of the third surface, and both surfaces of the fourth surface.

A second width of a wall portion disposed between two adjacent grooves among the plurality of grooves may be smaller than the first width.

The second width may be in the range of 0.1 to 0.9 times the first width.

A shortest distance between a wall portion of the second surface and a wall portion of the third surface may be in the range of 1 to 10 μm in a corner region in which a surface disposed in a space formed by the second substrate, the second surface, the third surface, and the fourth surface of both surfaces of the second surface meets a surface disposed to face the second substrate of both surfaces of the third surface.

A shortest distance between a wall portion of a surface disposed in a space formed by the second substrate, the second surface, the third surface, and the fourth surface of both surfaces of the second surface and the second substrate may be in the range of 1 to 10 μm.

The first width may be in the range of 0.03 to 0.1 times a thickness of the third surface.

The depth may be in the range of 0.03 to 0.1 times the thickness of the third surface.

The first width may be greater than or equal to the depth.

The second width may be in the range of 0.01 to 0.1 times the thickness of the third surface.

A plurality of intersecting grooves extending in a direction intersecting a direction in which the plurality of grooves extend may be further included in the surface of the heat sink.

A region in which a bottom surface of the groove meets a side surface of the wall portion may have a rounded shape.

The heat sink may further include a protrusion disposed on at least one surface on a path through which the fluid passes.

The first surface may be disposed in contact with the second surface by an adhesive layer.

A power generator according to one embodiment of the present invention includes a cooling part, and a thermoelectric module disposed on the cooling part, wherein the thermoelectric module includes a first substrate, a first electrode disposed on the first substrate, a semiconductor structure disposed on the first electrode, a second electrode disposed on the semiconductor structure, a second substrate disposed on the second electrode, and a heat sink disposed on the second substrate, wherein a surface of the heat sink includes a plurality of grooves extending in a first direction in which a fluid passes, the plurality of grooves have the same first width in a direction parallel to the surface of the heat sink and perpendicular to the first direction and have the same depth in a direction perpendicular to the surface of the heat sink, and the first width is in the range of 1 to 10 μm, and the depth is in the range of 1 to 10 μm.

Advantageous Effects

According to the embodiments of the present invention, it is possible to obtain the thermoelectric module with excellent performance and high reliability. In particular, according to the embodiments of the present invention, it is possible to obtain the thermoelectric module with high heat exchange performance of the heat sink.

The thermoelectric element according to the embodiments of the present invention can be applied to not only small-scale applications but also large-scale applications such as vehicles, ships, steel mills, and incinerators.

MODE FOR INVENTION

Hereinafter, exemplary embodiments according to the present invention will be described in detail with reference to the accompanying drawings.

However, the technical spirit of the present invention is not limited to some of the described embodiments, but may be implemented in various different forms, and one or more of the components among the embodiments may be used by being selectively coupled or substituted without departing from the scope of the technical spirit of the present invention.

In addition, terms (including technical and scientific terms) used in embodiments of the present invention may be construed as meaning that may be generally understood by those skilled in the art to which the present invention pertains unless explicitly specifically defined and described, and the meanings of the commonly used terms, such as terms defined in a dictionary, may be construed in consideration of contextual meanings of related technologies.

In addition, the terms used in the embodiments of the present invention are for describing the embodiments and are not intended to limit the present invention.

In the specification, a singular form may include a plural form unless otherwise specified in the phrase, and when described as "at least one (or one or more) of A, B, and C," one or more among all possible combinations of A, B, and C may be included.

In addition, terms such as first, second, A, B, (a), and (b) may be used to describe components of the embodiments of the present invention.

These terms are only for the purpose of distinguishing one component from another component, and the nature, sequence, order, or the like of the corresponding components is not limited by these terms.

In addition, when a first component is described as being "connected," "coupled," or "joined" to a second component, it may include a case in which the first component is directly connected, coupled, or joined to the second component, but also a case in which the first component is "connected," "coupled," or "joined" to the second component by other components present between the first component and the second component.

In addition, when a certain component is described as being formed or disposed on "on (above)" or "below (under)" another component, the terms "on (above)" or "below (under)" may include not only a case in which two components are in direct contact with each other, but also a case in which one or more other components are formed or disposed between the two components. In addition, when described as "on (above) or below (under)," it may include the meaning of not only an upward direction but also a downward direction based on one component.

Figure 1:
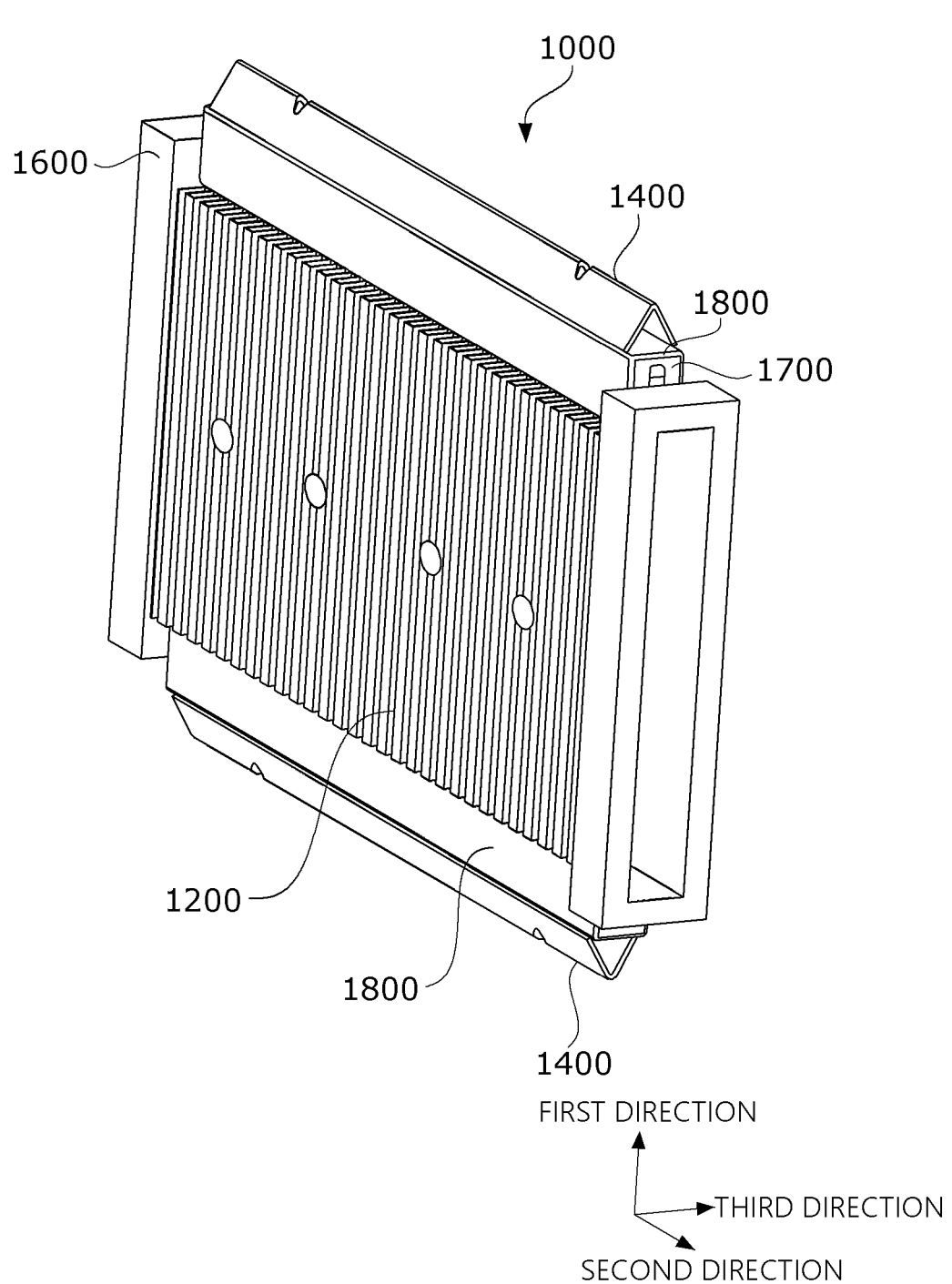
FIG. 1 is a perspective view of one example of a heat conversion device to which a thermoelectric module according to one embodiment of the present invention is applied.
Figure 2:
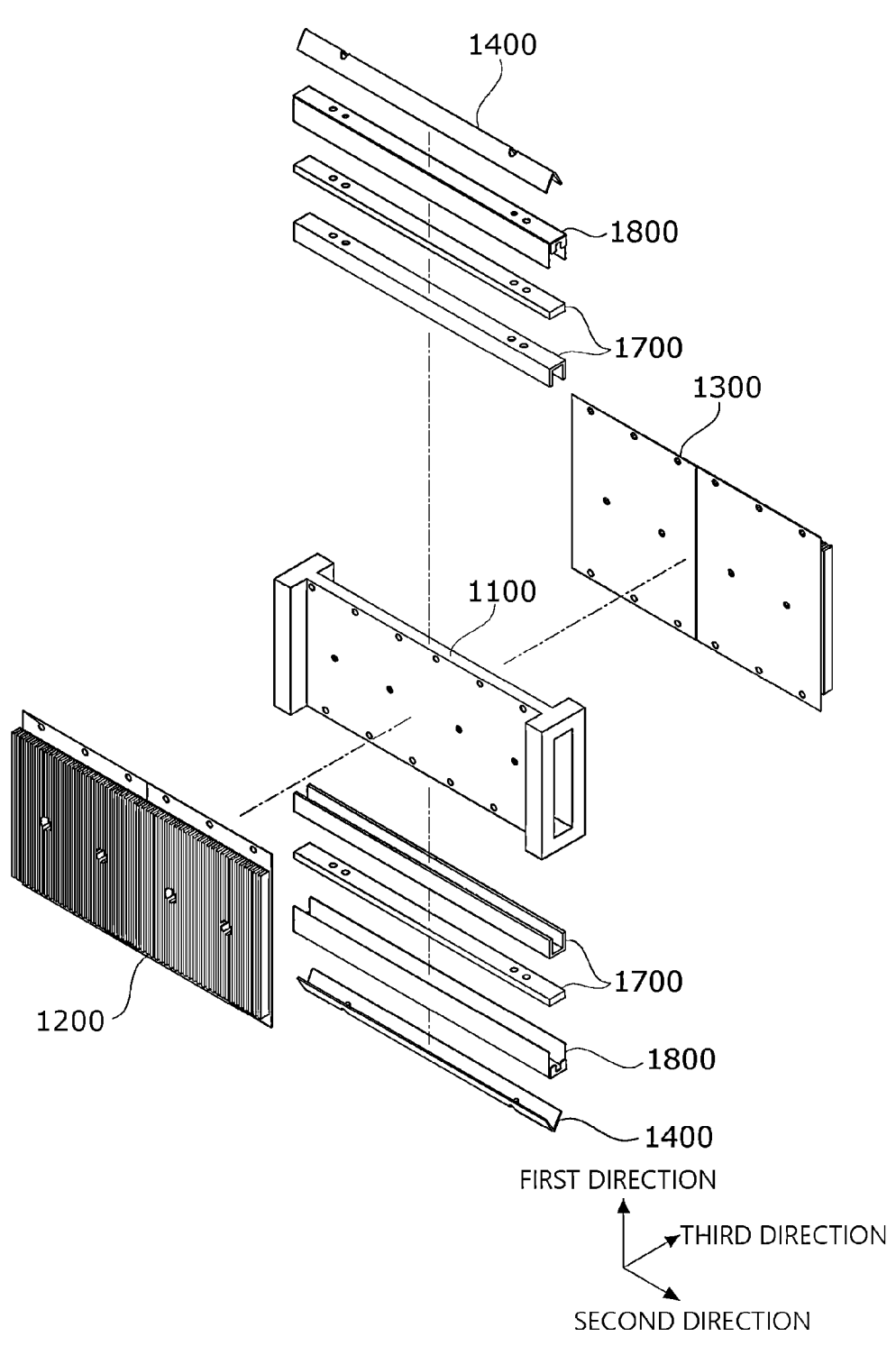
FIG. 2 is an exploded perspective view of the heat conversion device of FIG. 1.

FIG. 1 is a perspective view of one example of a heat conversion device to which a thermoelectric module according to one embodiment of the present invention is applied, and FIG. 2 is an exploded perspective view of the heat conversion device of FIG. 1.

Referring to FIGS. 1 and 2, a heat conversion device 1000 includes a duct 1100, a first thermoelectric module 1200, a second thermoelectric module 1300, and a gas guide member 1400. Here, the heat conversion device 1000 may generate power using a temperature difference between a cooling fluid flowing through the inside of the duct 1100 and a hot gas passing through the outside of the duct 1100.

To this end, the first thermoelectric module 1200 may be disposed on one surface of the duct 1100, and the second thermoelectric module 1300 may be disposed on the other surface of the duct 1100. In this case, a surface disposed to face the duct 1100 of both surfaces of each of the first thermoelectric module 1200 and the second thermoelectric module 1300 may become a low-temperature portion, and power may be generated by using a temperature difference between the low-temperature portion and a high-temperature portion. The thermoelectric module according to the embodiment of the present invention may be applied to the first thermoelectric module 1200 or the second thermoelectric module 1300.

The cooling fluid flowing into the duct 1100 may be water, but is not limited thereto, and may be any type of fluid with cooling performance. A temperature of the cooling fluid flowing into the duct 1100 may be lower than 100° C., preferably, lower than 50° C., and more preferably, lower than 40° C., but is not limited thereto. A temperature of the cooling fluid discharged after passing through the duct 1100 may be higher than a temperature of the cooling fluid flowing into the duct 1100.

The cooling fluid is introduced from a cooling fluid inlet of the duct 1100 and is discharged through a cooling fluid outlet.

Although not shown, heat dissipation fins may be disposed on an inner wall of the duct 1100. Shapes and number of heat dissipation fins, an area of the inner wall of the duct 1100, etc. may be changed in any of various ways according to a temperature of the cooling fluid, a temperature of waste heat, a required power generation capacity, etc.

Meanwhile, the first thermoelectric module 1200 is disposed on one surface of the duct 1100, and the second thermoelectric module 1300 is disposed symmetrically to the first thermoelectric module 1200 on the other surface of the duct 1100.

Here, the first thermoelectric module 1200 and the second thermoelectric module 1300 disposed symmetrically to the first thermoelectric module 1200 may be referred to as a pair of thermoelectric modules or a unit thermoelectric module.

The gas guide member 1400, a sealing member 1800, and an insulating member 1700 may be further disposed in the duct 1100 in a direction in which air flows.

The hot gas passing through the outside of the duct 1100 may be waste heat generated from an engine of a vehicle, a vessel, etc., but is not limited thereto. For example, a temperature of the hot gas may be 100° C. or higher, preferably, 200° C. or higher, and more preferably, in the range of 220° C. to 250° C., but is not limited thereto, and the hot gas may be a fluid having a higher temperature than the cooling fluid flowing into the duct 1100.

FIGS. 1 and 2 are only one example of the heat conversion device to which the thermoelectric module according to the embodiment of the present invention is applied, and a structure of the heat conversion device to which the thermoelectric module according to the embodiment of the present invention is applied is not limited thereto.

Figure 3:
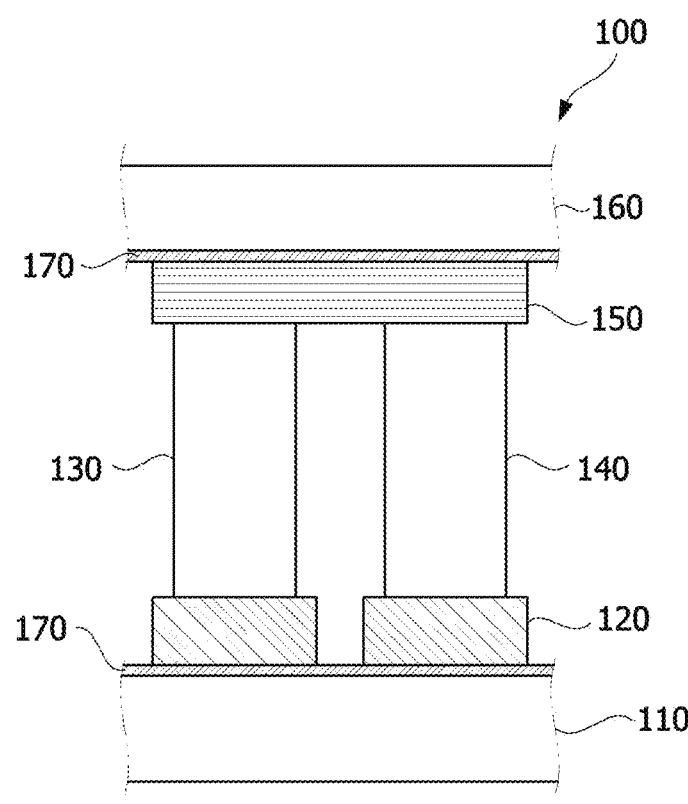
FIG. 3 is a cross-sectional view of a thermoelectric element.
Figure 4:
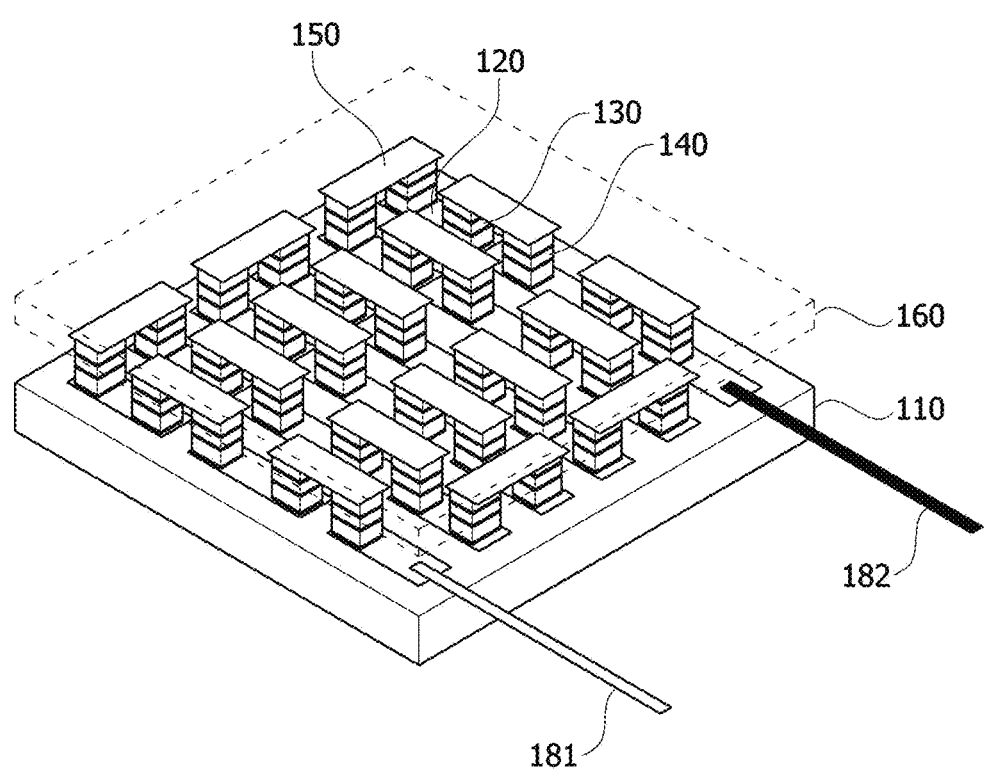
FIG. 4 is a perspective view of the thermoelectric element.

FIG. 3 is a cross-sectional view of a thermoelectric element, and FIG. 4 is a perspective view of the thermoelectric element.

Referring to FIGS. 3 and 4, the thermoelectric element 100 includes a lower substrate 110, a lower electrode 120, a P-type thermoelectric leg 130, an N-type thermoelectric leg 140, an upper electrode 150, and an upper substrate 160. The thermoelectric element 100 may be a thermoelectric element included in the first thermoelectric module 1200 or the second thermoelectric module 1300 according to the embodiment of the present invention.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Therefore, the plurality of P-type thermoelectric legs 130 and the plurality of N-type thermoelectric legs 140 are electrically connected by the upper electrodes 120 and the lower electrodes 150. A pair of P-type thermoelectric legs 130 and N-type thermoelectric legs 140 disposed between the lower electrode 120 and the upper electrode 150 and electrically connected may form a unit cell.

For example, when a voltage is applied to the lower electrode 120 and the upper electrode 150 through lead wires 181 and 182, due to the Peltier effect, a substrate in which a current flows from the P-type thermoelectric leg 130 to the N-type thermoelectric leg 140 may absorb heat to serve as a cooling part, and a substrate in which a current flows from the N-type thermoelectric leg 140 to the P-type thermoelectric leg 130 may be heated to serve as a heating part. Alternatively, when a temperature difference between the lower electrode 120 and the upper electrode 150 is applied, charges in the P-type thermoelectric leg 130 and the N-type thermoelectric leg 140 may be moved due to the Seebeck effect to generate electricity.

In FIGS. 3 and 4, although it is shown that the lead wires 181 and 182 are disposed on the lower substrate 110, the present invention is not limited thereto, and the lead wires 181 and 182 may be disposed on the upper substrate 160, one of the lead wires 181 and 182 may be disposed on the lower substrate 110, or the other may be disposed on the upper substrate 160.

Here, the P-type thermoelectric leg 130 and the N-type thermoelectric leg 140 may be bismuth telluride (Bi—Te)-based thermoelectric legs containing bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te, which is the main raw material, in an amount in the range of 99 to 99.999 wt % with respect to the total weight of 100 wt % and contain at least one of nickel (Ni), aluminum (Al), copper (Cu), silver (Ag), lead (Pb), boron (B), gallium (Ga), and indium (In) in an amount in the range of 0.001 to 1 wt %. The N-type thermoelectric leg 140 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Sb—Te, which is the main raw material, in an amount in the range of 99 to 99.999 wt % with respect to the total weight of 100 wt % and contain at least one of nickel (Ni), aluminum (Al), copper (Cu), silver (Ag), lead (Pb), boron (B), gallium (Ga), and indium (In) in an amount in the range of 0.001 to 1 wt %. Therefore, in the present specification, the thermoelectric leg may be referred to as a semiconductor structure, a semiconductor element, a semiconductor material layer, a conductive semiconductor structure, a thermoelectric structure, a thermoelectric material layer, a thermoelectric semiconductor structure, a thermoelectric semiconductor element, a thermoelectric semiconductor material layer, etc.

The P-type thermoelectric leg 130 and the N-type thermoelectric leg 140 may be formed in a bulk type or stack type. In general, the bulk-type P-type thermoelectric leg 130 or the bulk-type N-type thermoelectric leg 140 may be obtained through a process of manufacturing an ingot through thermal treatment for a thermoelectric material, crushing and sieving the ingot to acquire powder for the thermoelectric leg, then sintering the powder, and cutting a sintered body. In this case, the P-type thermoelectric leg 130 and the N-type thermoelectric leg 140 may be polycrystalline thermoelectric legs. For polycrystalline thermoelectric legs, when the powder for the thermoelectric leg is sintered, the P-type and N-type thermoelectric legs may be compressed at a pressure in the range of 100 MPa to 200 MPa. For example, when the P-type thermoelectric leg 130 is sintered, the powder for the thermoelectric leg may be sintered at a pressure in the range of 100 to 150 MPa, preferably, 110 to 140 MPa, and more preferably, 120 to 130 MPa. In addition, when the N-type thermoelectric leg 140 is sintered, the powder for the thermoelectric leg may be sintered at a pressure in the range of 150 to 200 MPa, preferably, 160 to 195 MPa, and more preferably, 170 to 190 MPa. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stack-type P-type thermoelectric leg 130 or the stack-type N-type thermoelectric leg 140 may be obtained through a process of coating a sheet-shaped base with a paste containing a thermoelectric material to form a unit member, and then stacking and cutting the unit members.

In this case, the pair of the P-type thermoelectric leg 130 and the N-type thermoelectric leg 140 may have the same shape and volume or have different shapes and volumes. For example, since the electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, etc.

Alternatively, the P-type thermoelectric leg 130 or the N-type thermoelectric leg 140 may have a stack-type structure. For example, the P-type thermoelectric leg or the N-type thermoelectric leg may be formed by a method of stacking a plurality of structures coated with a semiconductor material on a sheet-shaped base and then cutting the plurality of structures. Therefore, it is possible to prevent a loss of a material and improve electrical conduction characteristics. Since each structure may further include an electrical conduction layer with an opening pattern, it is possible to increase a bonding strength between the structures, reduce thermal conductivity, and increase electrical conductivity.

Alternatively, the P-type thermoelectric leg 130 or the N-type thermoelectric leg 140 may be formed to have a different cross-sectional area in one thermoelectric leg. For example, cross-sectional areas of both end portions disposed toward the electrode in one thermoelectric leg may be greater than a cross-sectional area between the both end portions. Therefore, since a temperature difference between the both end portions may be large, it is possible to increase thermoelectric efficiency.

The performance of the thermoelectric element according to one embodiment of the present invention may be represented by a thermoelectric figure of merit (ZT). The ZT can be represented by Equation 1.

$$ZT = \alpha^2 \cdot \sigma \cdot T/k \qquad \text{[Equation 1]}$$

Here, $\alpha$ denotes a Seebeck coefficient [V/K], $\sigma$ denotes an electrical conductivity [S/m], and $\alpha^2\sigma$ denotes a power factor [W/mK$^2$]. In addition, T denotes a temperature, and k denotes a thermal conductivity [W/mK]. k can be represented by a·cp·$\rho$, in which a denotes a thermal diffusivity [cm$^2$/S], cp denotes a specific heat [J/gK], and $\rho$ denotes a density [g/cm$^3$].

To obtain a thermoelectric performance index of the thermoelectric element, a Z value (V/K) may be measured by using a Z meter, and the ZT may be calculated by using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may contain at least one of copper (Cu), silver (Ag), aluminum (Al), and nickel (Ni) and have a thickness in the range of 0.01 to 0.3 mm. When a thickness of the lower electrode 120 or the upper electrode 150 is smaller than 0.01 mm, a function as an electrode may be degraded, thereby reducing the electrical conduction performance, and when the thickness exceeds 0.3 mm, the electrical conduction efficiency can be reduced due to an increase in resistance.

In addition, the lower substrate 110 and the upper substrate 160 facing each other may be metal substrates, and thicknesses thereof may be in a range of 0.1 to 1.5 mm. When the thickness of the metal substrate is smaller than 0.1 mm or exceeds 1.5 mm, the heat radiation characteristics or thermal conductivity may be excessively high, thereby reducing the reliability of the thermoelectric element. In addition, when the lower substrate 110 and the upper substrate 160 are metal substrates, an insulating layer 170 may be further formed between the lower substrate 110 and the lower electrode 120 and between the upper substrate 160 and the upper electrode 150. The insulating layer 170 may contain a material with a thermal conductivity in the range of 1 to 20 W/mK.

In this case, the lower substrate 110 and the upper substrate 160 may be formed to have different sizes. For example, a volume, thickness, or area of one of the lower substrate 110 and the upper substrate 160 may be formed to be greater than a volume, thickness, or area of the other. Therefore, it is possible to enhance the heat absorption or heat dissipation performance of the thermoelectric element. For example, at least one of a volume, thickness, or area of a substrate which is disposed in a high-temperature region for the Seebeck effect, which is applied as a heating region for the Peltier effect, or on which a sealing member for protecting a thermoelectric module from an external environment is disposed may be greater than at least one of a volume, thickness, or area of the other.

In addition, a heat dissipation pattern, for example, an uneven pattern may be formed on a surface of at least one of the lower substrate 110 and the upper substrate 160. Therefore, it is possible to enhance the heat dissipation performance of the thermoelectric element. When the uneven pattern is formed on the surface in contact with the P-type thermoelectric leg 130 or the N-type thermoelectric leg 140, it is possible to improve the bonding characteristics between the thermoelectric leg and the substrate. The thermoelectric element 100 includes the lower substrate 110, the lower electrode 120, the P-type thermoelectric leg 130, the N-type thermoelectric leg 140, the upper electrode 150, and the upper substrate 160.

Although not illustrated, a sealing member may be further disposed between the lower substrate 110 and the upper substrate 160. The sealing member may be disposed on side surfaces of the lower electrode 120, the P-type thermoelectric leg 130, the N-type thermoelectric leg 140, and the upper electrode 150 between the lower substrate 110 and the upper substrate 160. Therefore, the lower electrode 120, the P-type thermoelectric leg 130, the N-type thermoelectric leg 140, and the upper electrode 150 may be sealed from external moisture, heat, contamination, etc. Here, the sealing member may include a sealing case to be spaced a predetermined distance from side surfaces of outermost portions of the plurality of lower electrodes 120, outermost portions of the plurality of P-type thermoelectric legs 130 and the plurality of N-type thermoelectric legs 140, and outermost portions of the plurality of upper electrodes 150, a sealing part disposed between the sealing case and the lower substrate 110, and a sealing part disposed between the sealing case and the upper substrate 160. As described above, the sealing case may be in contact with the lower substrate 110 and the upper substrate 160 via the sealing parts. Therefore, when the sealing case is in direct contact with the lower substrate 110 and the upper substrate 160, heat conduction occurs through the sealing case, and as a result, it is possible to solve a problem that the temperature difference between the lower substrate 110 and the upper substrate 160 is reduced. Here, the sealing part may include at least one of an epoxy resin and a silicone resin or include a tape having both surfaces coated with at least one of the epoxy resin and the silicone resin. The sealing parts may serve to make airtightness between the sealing case and the lower substrate 110 and between the sealing case and the upper substrate 160, can further increase the sealing effect of the lower electrode 120, the P-type thermoelectric leg 130, the N-type thermoelectric leg 140, and the upper electrode 150, and can be used interchangeably with a finishing part, a finishing layer, a waterproofing part, a waterproofing layer, etc.

However, the above description of the sealing member is merely an example, and the sealing member may be modified into any form. Although not shown, an insulating part may be further included to surround the sealing member. Alternatively, the sealing member may include an insulating component.

As described above, the terms "lower substrate 110," "lower electrode 120," "upper electrode 150," and "upper substrate 160" are used, but are merely, arbitrarily referred to as an upper portion and a lower portion for ease of understanding and convenience of description, and their locations may be reversed so that the lower substrate 110 and the lower electrode 120 are disposed above, and the upper electrode 150 and the upper substrate 160 are disposed below. Hereinafter, for convenience of description, the lower substrate 110, the lower electrode 120, the upper electrode 150, and the upper substrate 160 are referred to as the first substrate 110, the first electrode 120, the second electrode 150, and the second substrate 160, respectively.

Figure 5:
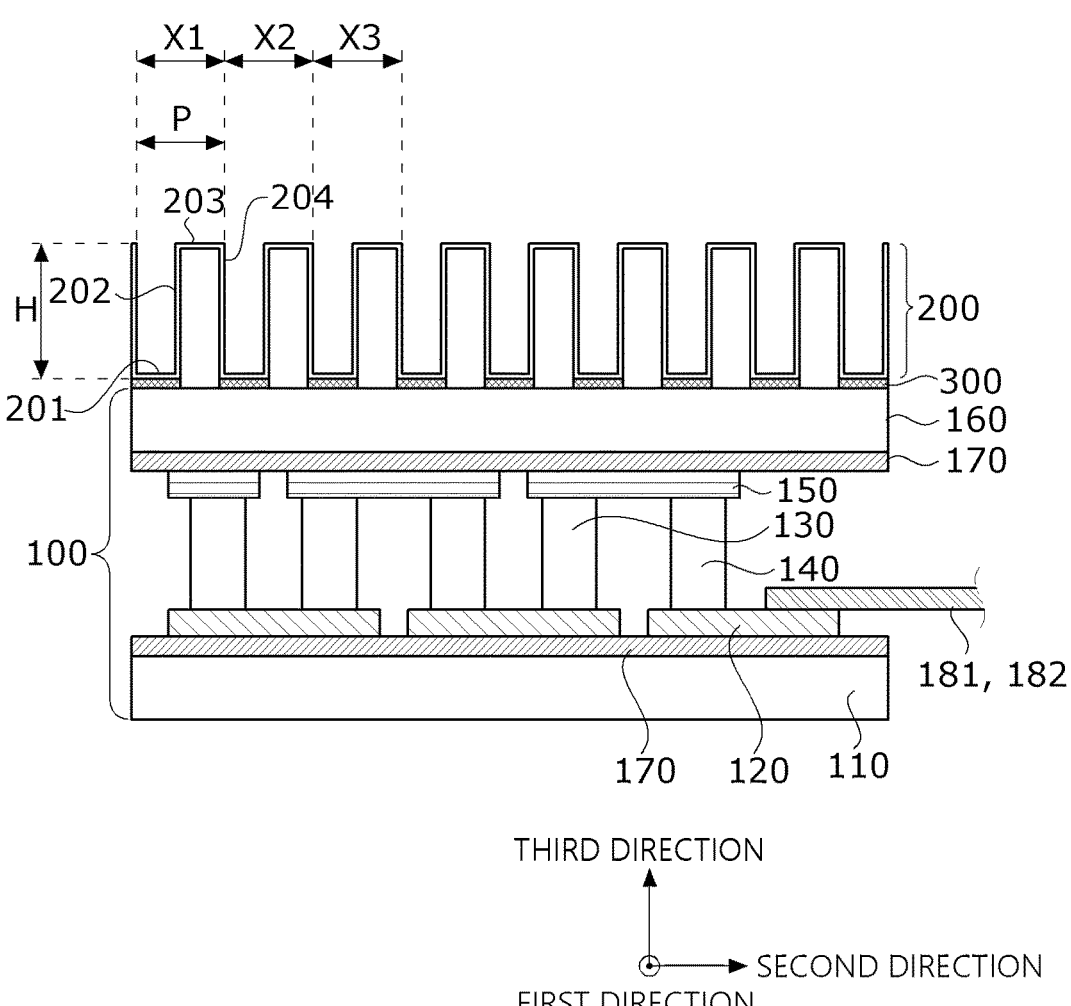
FIG. 5 is one example of a cross-sectional view of the thermoelectric module in which a heat sink is disposed on the thermoelectric element.
Figure 6:
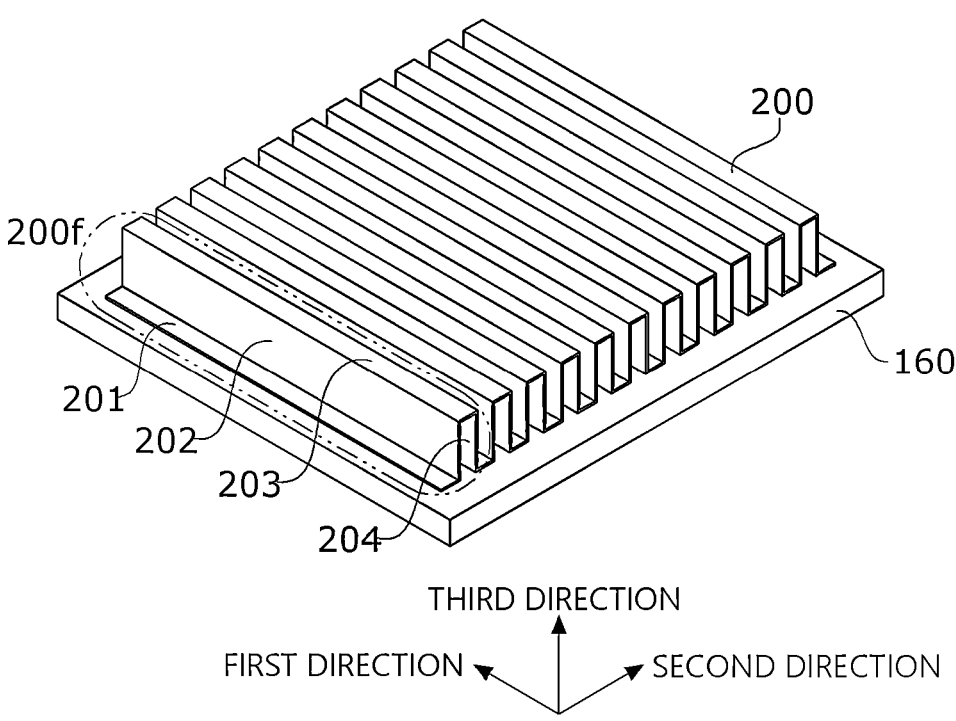
FIG. 6 is a perspective view of a substrate and the heat sink in the thermoelectric module shown in FIG. 5.

FIG. 5 is one example of a cross-sectional view of the thermoelectric module in which a heat sink is disposed on the thermoelectric element, and FIG. 6 is a perspective view of a substrate and the heat sink in the thermoelectric module shown in FIG. 5.

Referring to FIGS. 5 and 6, a heat sink 200 is disposed on the second substrate 160 of the thermoelectric element 100. As described above, the thermoelectric element 100 may include the first substrate 110, the first electrode 120, the P-type thermoelectric leg 130, the N-type thermoelectric leg 140, the second electrode 150, the second substrate 160, and the insulating layer 170, and the lead wires 181 and 182 may be connected to the first electrode 120. The first thermoelectric module 1200 or the second thermoelectric module 1300 according to the embodiment of the present invention may include the heat sink 200 disposed on the thermoelectric element 100.

To this end, an adhesive layer 300 may be disposed on the second substrate 160, and the heat sink 200 may be disposed on the adhesive layer 300. The second substrate 160 and the heat sink 200 may be bonded by the adhesive layer 300. Here, although an example in which the heat sink 200 is disposed on the upper substrate 160, that is, the second substrate 160 is described, it is for convenience of description, and the present invention is not limited thereto. That is, the heat sink 200 having the same structure as the embodiment of the present invention may be disposed on the lower substrate 110, that is, the first substrate 110.

In this case, the heat sink 200 may be implemented to form an airflow path using a plate-shaped base to be in surface contact with a fluid, for example, air passing through the heat sink 200 in a first direction. That is, the heat sink 200 may have a structure that folds the base, that is, a folding structure so that a repetitive pattern with a predetermined pitch P and height H is formed. A unit of the repetitive pattern, that is, each pattern may be referred to as a fin 200f.

According to the embodiment of the present invention, the heat sink 200 may have a shape in which predetermined patterns are connected by being regularly repeated. That is, the heat sink 200 may include a first pattern X1, a second pattern X2, and a third pattern X3, and these patterns may be an integrated plate connected by being sequentially repeated multiple times.

According to the embodiment of the present invention, each of the patterns X1, X2, and X3 may include a first surface 201, a second surface 202, a third surface 203, and a fourth surface 204 that are sequentially connected.

The first surface 201 may be disposed on the second substrate 160 and disposed to be in contact with the adhesive layer 300. The second surface 202 may be connected to the first surface 201 and disposed in a direction perpendicular to the second substrate 160. That is, the second surface 202 may extend upward from one end of the first surface 201. The third surface 203 may be connected to the second surface 202 and disposed to face the second substrate 160. In this case, a distance between the second substrate 160 and the third surface 203 may be greater than a distance between the second substrate 160 and the first surface 201. The fourth surface 204 may be connected to the third surface 203 and may be disposed perpendicular to the second substrate 160 and to face the second surface 202.

The first surface 201, the second surface 202, the third surface 203, and the fourth surface 204 may be an integrated plate having a sequentially folded structure, a set of the first surface 201, the second surface 202, the third surface 203, and the fourth surface 204 may form one fin 200*f*, and each fin 200*f* may extend in a direction in which the fluid passes, that is, the first direction.

Meanwhile, when the fluid passing through the heat sink is exhaust gas, fine particles in the exhaust gas may be adsorbed on the surface of the heat sink. The fine particles in the exhaust gas are black, amorphous, and fine powder substances produced by incomplete combustion or thermal decomposition of an organic material and may be referred to as soot. The fine particles in the exhaust gas may mostly consist of carbon and contain some oxygen and small amounts of nitrogen and hydrogen. An average particle size of the soot may be in the range of several nm to hundreds of μm.

Figure 7:
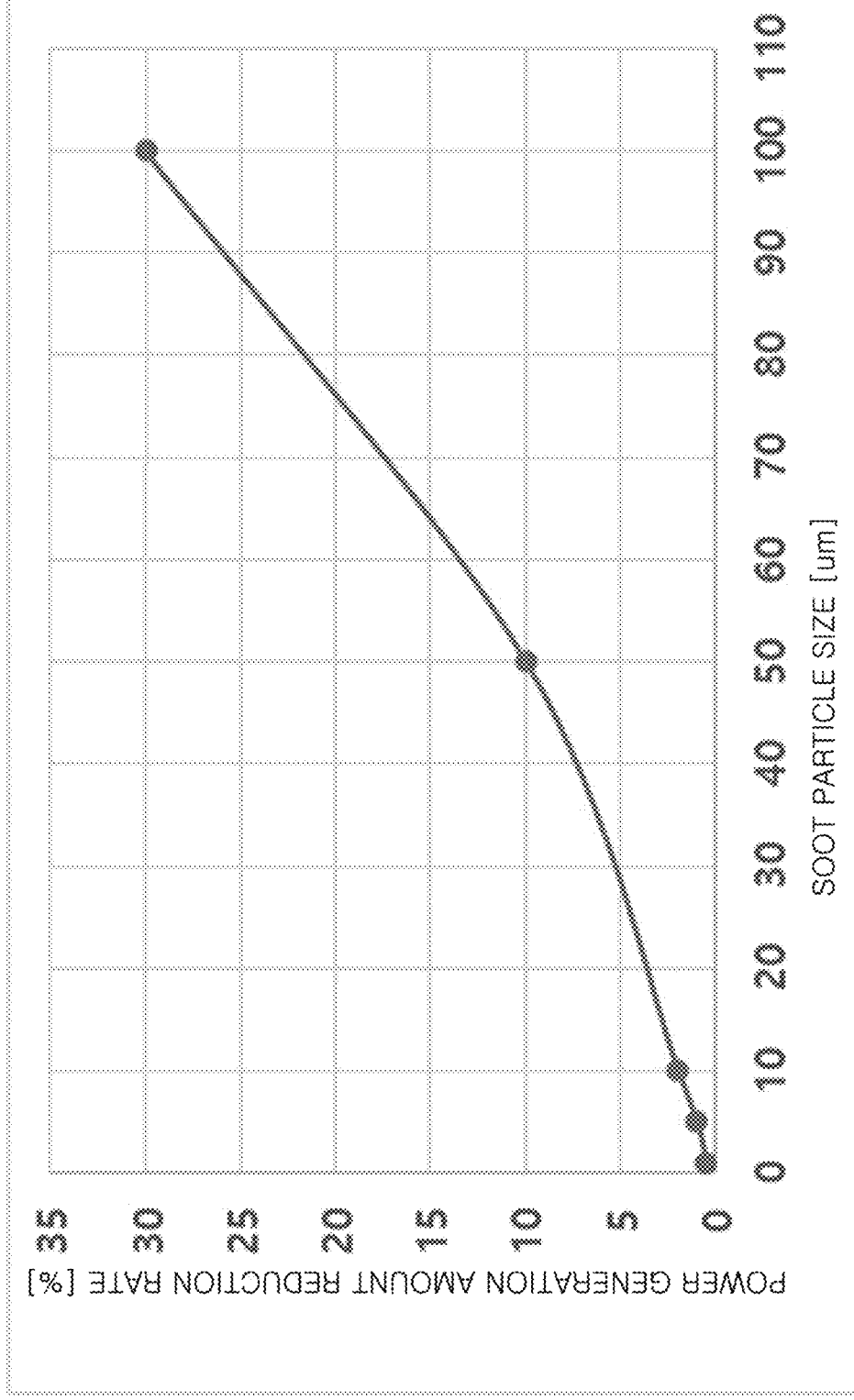
FIG. 7 is a graph showing a power generation amount reduction rate for each particle size of soot included in a fluid when the fluid passes through the heat sink for 1000 hours.

FIG. 7 is a graph showing a power generation amount reduction rate for each particle size of soot included in a fluid when the fluid passes through the heat sink for 1000 hours.

Referring to FIG. 7, it can be seen that as the particle size of the soot increases, the power generation amount reduction rate increases. In particular, when the particle size of the soot is in the range of 10 μm to 100 μm, it can be seen that the power generation amount reduction rate of the thermoelectric module greatly increases to 2% to 30%.

It is because, when the soot is accumulated and adsorbed on the surface of the heat sink, the flow path of the fluid passing through the heat sink is blocked or the heat exchange performance of the heat sink is reduced. In some cases, heat is accumulated in the heat sink, thereby increasing the risk of fire.

The embodiment of the present invention is intended to minimize the adsorption of soot in the fluid passing through the heat sink by surface treatment of the heat sink.

Figure 8:
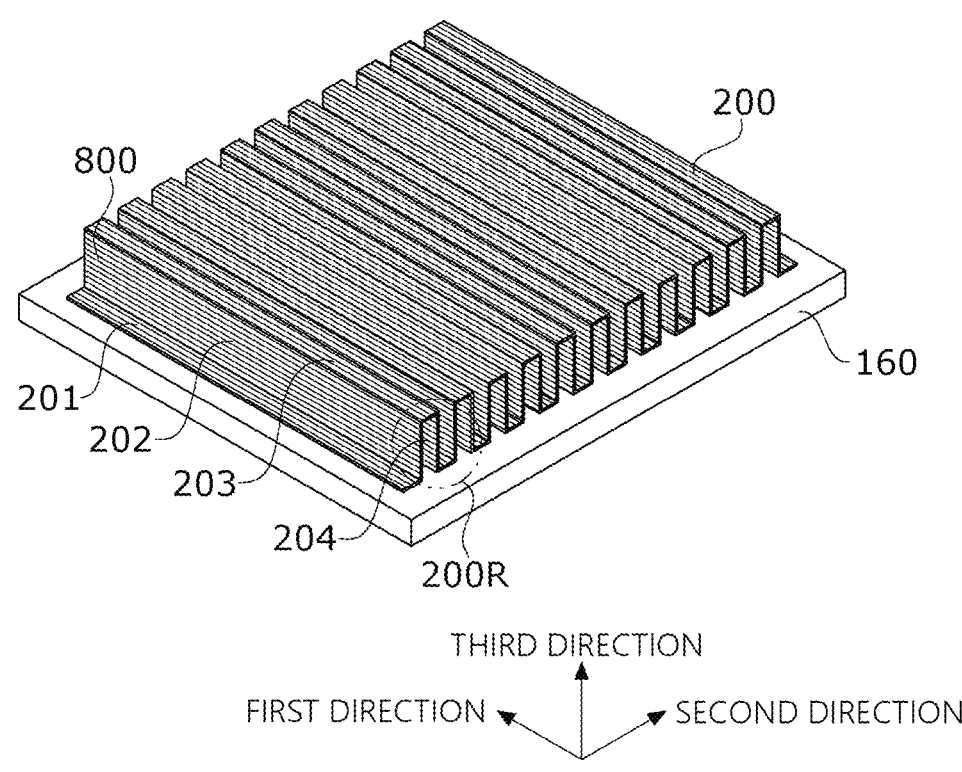
FIG. 8 is a perspective view of the substrate and the heat sink in the thermoelectric module according to one embodiment of the present invention.
Figure 9:
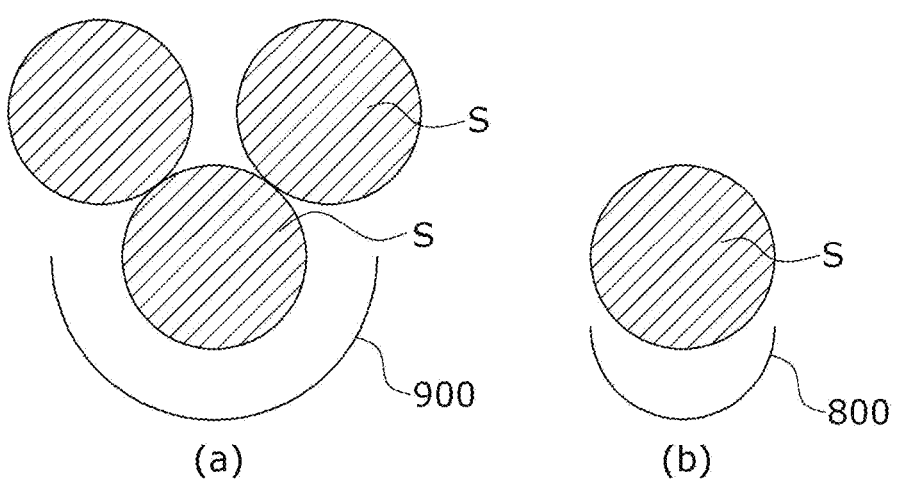
FIGS. 9 (a) and (b) show the relationship between a surface of the heat sink and adsorption of the soot.
Figure 10:
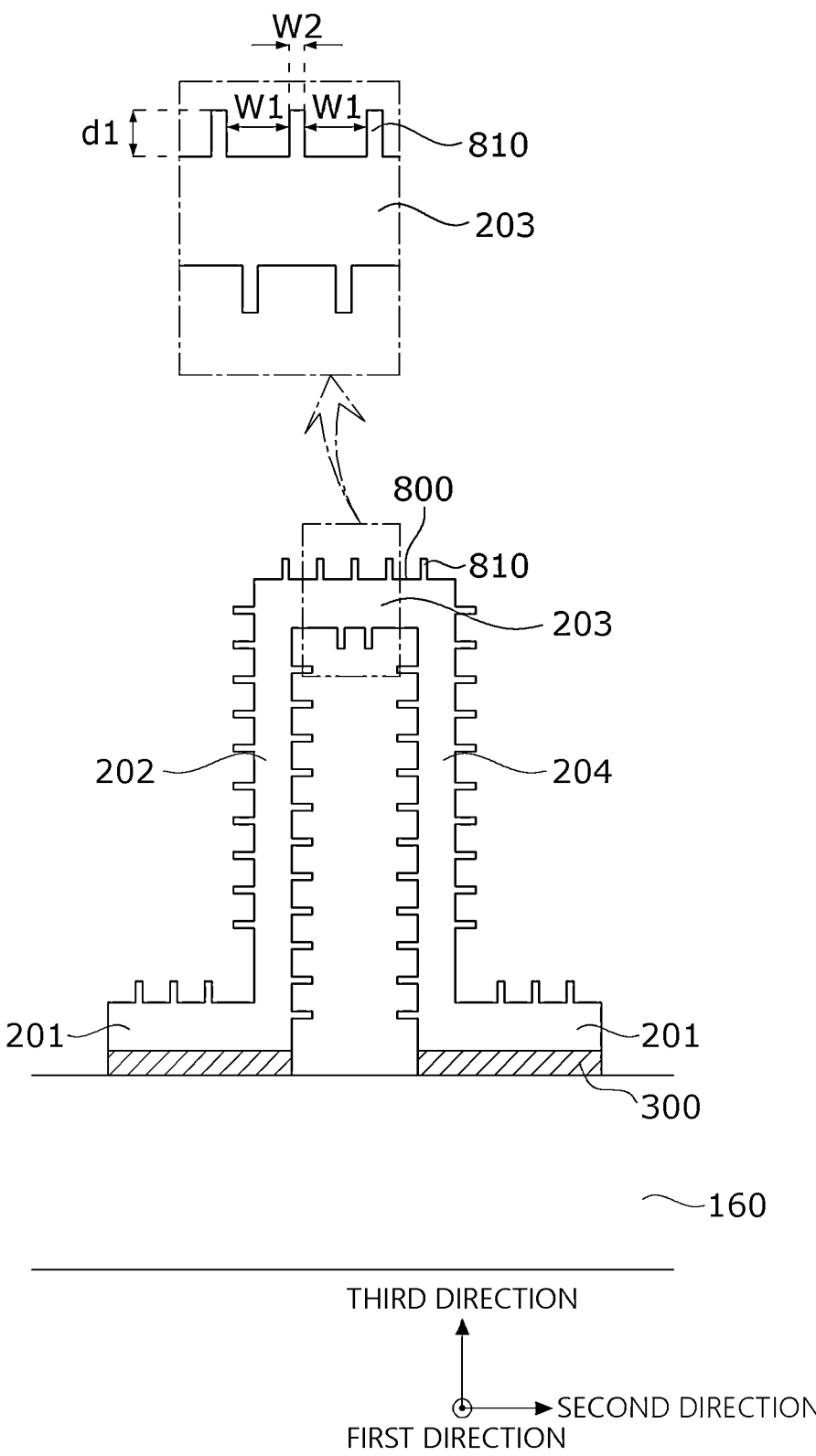
FIGS. 10 to 12 are enlarged views of 200R of FIG. 8.
Figure 11:
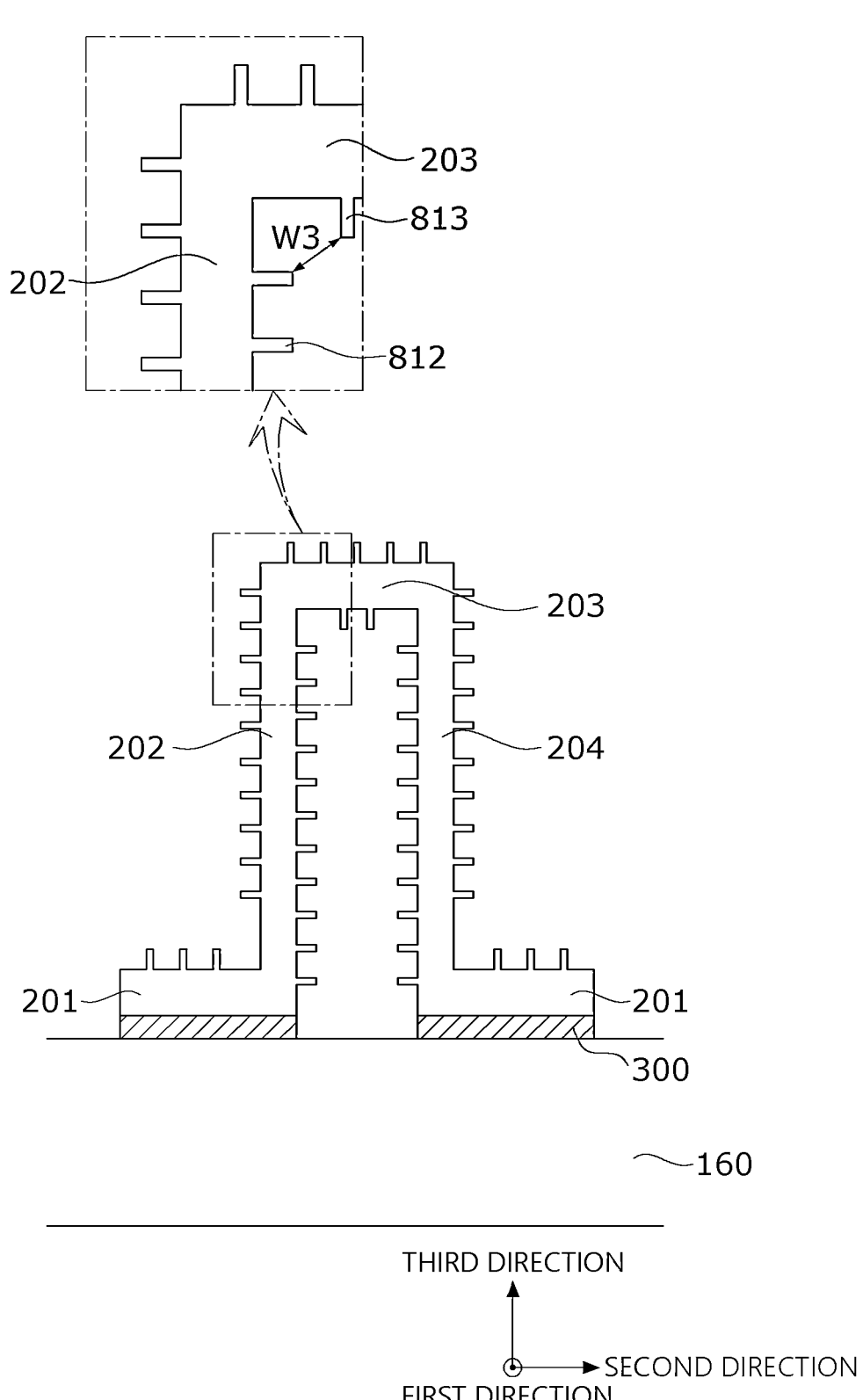
Figure 12:
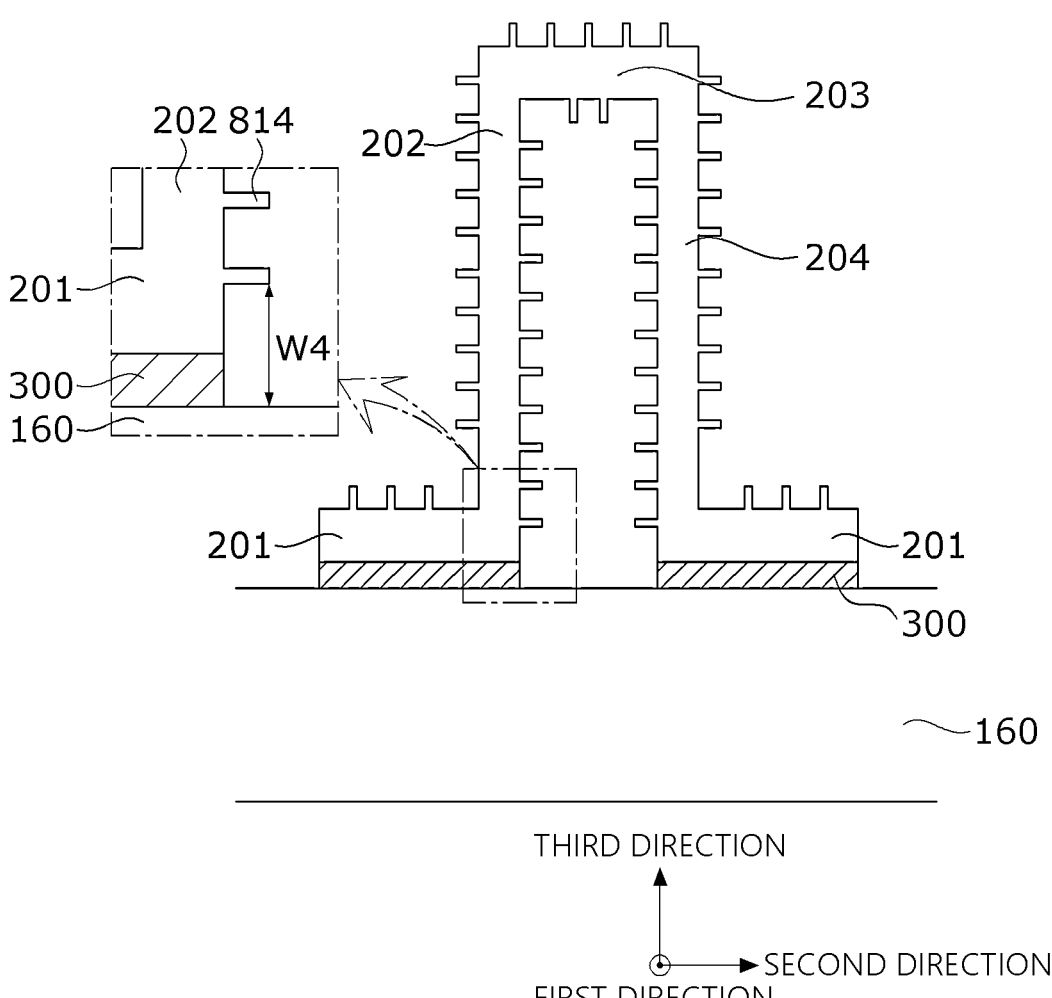

FIG. 8 is a perspective view of the substrate and the heat sink in the thermoelectric module according to one embodiment of the present invention, FIG. 9 shows the relationship between a surface of the heat sink and adsorption of the soot, and FIGS. 10 to 12 are enlarged views of 200R of FIG. 8.

Referring to FIG. 8, the surface of the heat sink 200 includes a plurality of grooves 800 extending in the first direction in which the fluid passes. The plurality of grooves 800 may extend from a front surface of the heat sink 200 to a rear surface of the heat sink 200 in the first direction in which the fluid passes, and the plurality of grooves 800 may have regular sizes, shapes, and intervals. In this case, at least one of the sizes, shapes, and intervals of the plurality of grooves 800 may be changed depending on the particle size of the soot in the fluid passing through the heat sink 200.

Generally, the heat sink 200 may be made of a metal material, and when the surface roughness of the heat sink 200 is not separately controlled, as shown in FIG. 9A, a groove 900 whose width is greater than a diameter of a soot S may be formed irregularly in the surface of the heat sink 200. When the soot S dispersed in the fluid meets the groove 900 whose width is greater than the diameter of the soot S on a path passing through the surface of the heat sink 200, the soot S may be accommodated in the groove 900. The soot S accommodated in the groove 900 may be adsorbed on the surface of the heat sink 200, and another soot S may be further adsorbed on the surface of the adsorbed soot S, and thus a soot lump is easily formed.

The embodiment of the present invention is intended to arrange the grooves 800 having controlled sizes, shapes, and intervals in the surface of the heat sink 200. As shown in FIG. 9B, when a width of the groove 800 disposed in the surface of the heat sink 200 is smaller than a width of the soot S, the soot S may not be accommodated in the groove 800, and may be discharged from the front surface of the heat sink 200 to the rear surface of the heat sink 200 by a force of the fluid passing through the surface of the heat sink 200.

In particular, when the grooves 800 disposed in the surface of the heat sink 200 have regular sizes, shapes, and intervals and extend from the front surface of the heat sink 200 to the rear surface of the heat sink 200 in the first direction in which the fluid passes, a constant flow rate of the fluid can be maintained, thereby further reducing the possibility that the soot S is adsorbed on the surface of the heat sink 200.

Referring to FIG. 10, the plurality of grooves 800 formed in the surface of the heat sink 200 have the same first width W1 in a direction parallel to the surface of the heat sink 200 and perpendicular to the first direction in which the fluid passes and have the same depth d1 in a direction perpendicular to the surface of the heat sink 200. In this case, the first width W1 may be in the range of 1 to 10 μm, and the depth d1 may be in the range of 1 to 10 μm. As described above, when the plurality of grooves 800 disposed in the surface of the heat sink 200 have the same width and depth and the width and depth of each of the plurality of grooves 800 are in the range of 1 to 10 μm, the constant flow rate of the fluid passing through the surface of the heat sink 200 may be maintained, and since the soot S having a diameter exceeding 10 μm may not be accommodated in the plurality of grooves 800 and is moved to the rear surface of the heat sink 200 by the force of the fluid passing through the surface of the heat sink 200, it is possible to prevent the soot S having the diameter exceeding 10 μm from being adsorbed on the surface of the heat sink 200. Therefore, as shown in FIG. 7, it is possible to minimize the problem that the power generation amount of the thermoelectric module is greatly reduced due to the deposition of the soot S having the diameter exceeding 10 μm.

In this case, the plurality of grooves 800 may be disposed in all surfaces through which the fluid passes. That is, the plurality of grooves 800 may be disposed in the first surface 201, the second surface 202, the third surface 203, and the fourth surface 204 of the heat sink 200. For example, the plurality of grooves 800 may be disposed in a surface opposite to the surface facing the second substrate 160 of both surfaces of the first surface 201, both surfaces of the second surface 202, both surfaces of the third surface 203, and both surfaces of the fourth surface 204. Therefore, it is possible to minimize the possibility that the soot S is deposited on all surfaces in contact with the fluid.

Meanwhile, the plurality of grooves 800 may be distinguished by a wall portion 810 disposed between two adjacent grooves. According to the embodiment of the present invention, a second width W2 of the wall portion 810 may be smaller than the first width W1 of the groove 800. Here, the second width W2 may be a width in a direction parallel to the surface of the heat sink 200 and perpendicular to the first direction in which the fluid passes. For example, the second width W2 of the wall portion 810 may be in the range of 0.1 to 0.9 times, preferably, 0.1 to 0.7 times, and more preferably, 0.1 to 0.5 times the first width W1 of the groove 800. Therefore, since the soot S that may not be accommodated in the groove 800 due to the diameter exceeding 10 μm may not be adsorbed on the surface of the wall portion 810, the soot S may be easily moved to the rear surface of the heat sink 200 by the force of the fluid passing through the surface of the heat sink 200.

According to the embodiment of the present invention, the first width W1 of the groove 800 may be in the range of 0.03 to 0.1 times the thickness of the heat sink 200, for example, a thickness T of the third surface 203. When the first width W1 of the groove 800 satisfies such a numerical range, it is possible to prevent the adsorption of the soot S and remove the adsorbed soot S by the flow of the fluid.

In addition, according to the embodiment of the present invention, a depth d1 of the groove 800 may be in the range of 0.03 to 0.1 times the thickness of the heat sink 200, for example, the thickness T of the third surface 203. When the depth d1 of the groove 800 satisfies such a numerical range, it is possible to prevent the adsorption of the soot S and remove the adsorbed soot S by the flow of the fluid.

In this case, the first width W1 of the groove 800 may be greater than or equal to the depth d1 of the groove 800. When a length of the depth d1 of the groove 800 is greater than a length of the first width W1 of the groove 800, the possibility that the soot S is adsorbed into the groove 800 increases.

In addition, according to the embodiment of the present invention, the second width W2 of the groove 810 may be in the range of 0.01 to 0.1 times the thickness of the heat sink 200, for example, the thickness T of the third surface 203. In this case, the second width W2 of the wall portion 810 may be smaller than or equal to the first width W1 of the groove 800. Therefore, it is possible to reduce the possibility that additional surface roughness occurs in the wall portion 810. Referring to FIG. 11, a shortest distance W3 between a wall portion 812 of the second surface 202 and a wall portion 813 of the third surface 203 may be in the range of 1 to 10 µm in a corner region in which a surface disposed in a space formed by the second substrate 160, the second surface 202, the third surface 203, and the fourth surface 204 of both surfaces of the second surface 202 meets a surface disposed to face the second substrate 160 of both surfaces of the third surface 203. Therefore, it is possible to prevent the problem that the soot S having the diameter exceeding 10 µm is adsorbed even in the corner regions of the second surface 202 and the third surface 203.

Referring to FIG. 12, a shortest distance W4 between a wall portion 814 of a surface disposed in a space formed by the second substrate 160, the second surface 202, the third surface 203, and the fourth surface 204 of both surfaces of the second surface 202 and the second substrate 160 may be in the range of 1 to 10 µm. Therefore, it is possible to prevent the problem that the soot S having the diameter exceeding 10 µm is adsorbed even in the corner regions of the second surface 202 and the second substrate 160.

According to the embodiment of the present invention, the plurality of grooves 800 may be formed by laser patterning, etching, or masking. For example, the heat sink 200 according to the embodiment of the present invention may be manufactured by a method of forming the plurality of grooves 800 in both surfaces of a metal substrate forming the heat sink 200 using a technique, such as laser patterning, etching, or masking, and then folding the first surface 201, the second surface 202, the third surface 203, and the fourth surface 204 to be connected sequentially. Therefore, it is possible to uniformly control the sizes, intervals, and shapes of the plurality of grooves 300.

Figure 13:
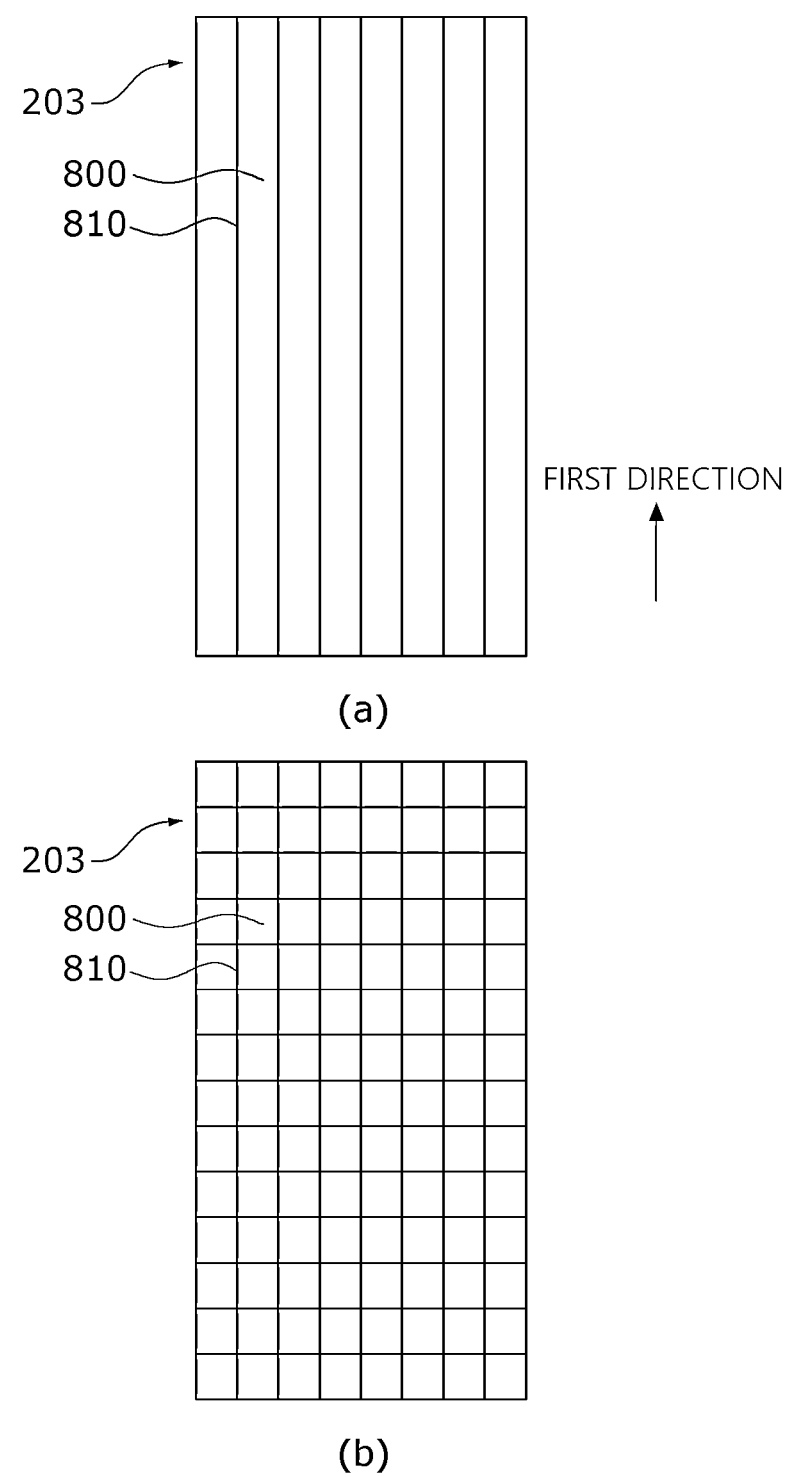
FIGS. 13 (a) and (b) are top views of a third surface of the heat sink according to an embodiment of the present invention.

FIG. 13 is a top view of a third surface of the heat sink according to an embodiment of the present invention.

Referring to FIG. 13A, as described above, the plurality of grooves 800 may extend in the first direction in which the fluid passes in the surface, for example, the third surface 203 of the heat sink 200. Therefore, the soot S may be easily discharged to the outside together with the fluid by the force of the fluid.

Alternatively, as shown in FIG. 13B, the plurality of grooves 800 may be formed in a grid shape in the surface, for example, the third surface 230 of the heat sink 200. That is, the plurality of grooves 800 may include a plurality of first grooves extending in the first direction in which the fluid passes, and a plurality of second grooves extending in a direction intersecting the direction in which the plurality of first grooves extend in the surface of the heat sink 200. Therefore, it is possible to minimize the possibility that the soot S is adsorbed to the heat sink 200 by the grid-shaped wall portion 810.

Figure 14:
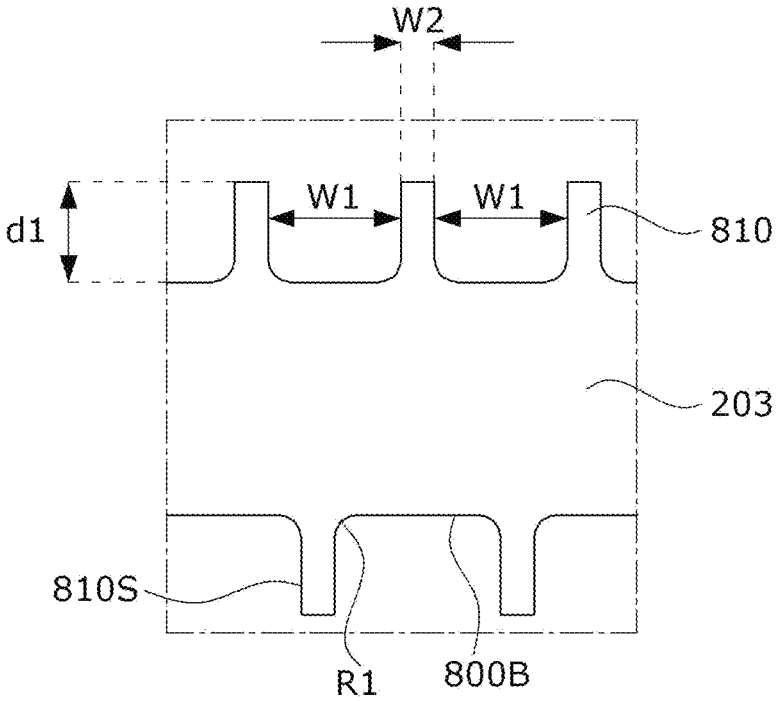
FIG. 14 is an enlarged view of a portion of a cross section of the third surface of the heat sink according to the embodiment of the present invention.

FIG. 14 is an enlarged view of a portion of a cross section of the third surface of the heat sink according to the embodiment of the present invention.

Referring to FIG. 14, a region R1 in which a bottom surface 800B of the groove 800 meets a side surface 810S of the wall portion 810 may be etched to have a rounded shape. Therefore, it is possible to reduce the possibility that the fine-sized soot S is adsorbed to a corner at which the bottom surface 800B of the groove 800 meets the side surface 810S of the wall 810.

Figure 15:
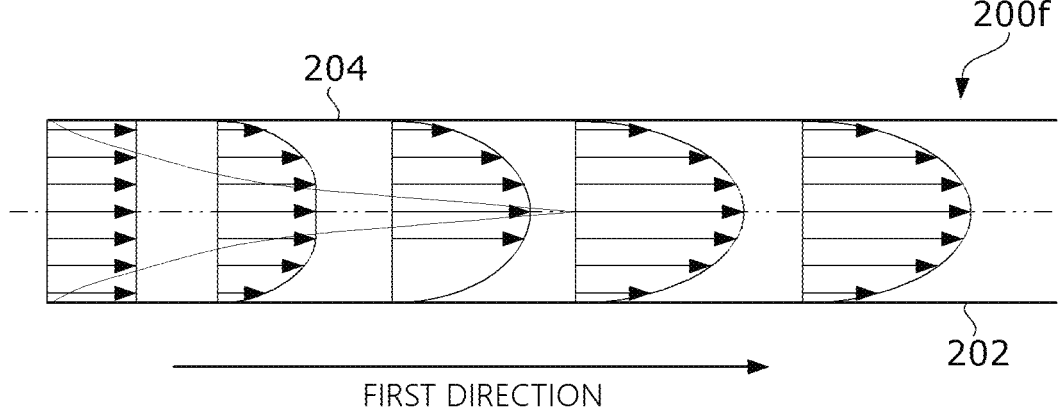
FIG. 15 shows a fluid flow in one fin of the heat sink.

FIG. 15 shows a fluid flow in one fin of the heat sink.

Referring to FIG. 15, it can be seen that a flow rate of a fluid flowing in a middle region in one fin 200f may be faster than a flow rate of a fluid flowing in an edge region. According to the principle of an entrance length of a laminar flow, the farther away from a fluid inlet, that is, the greater a length of one fin in the first direction, which is the direction in which the fluid flows, a flow rate difference of the fluid between the edge region and the middle region may increase. Therefore, a portion of the fluid flowing in the middle region of the fin 200f may be discharged without heat exchange with the heat sink.

The embodiment of the present invention is intended to increase heat exchange efficiency between the fluid and the heat sink by further arranging a structure forming a vortex in the fluid on the heat sink.

Figure 16:
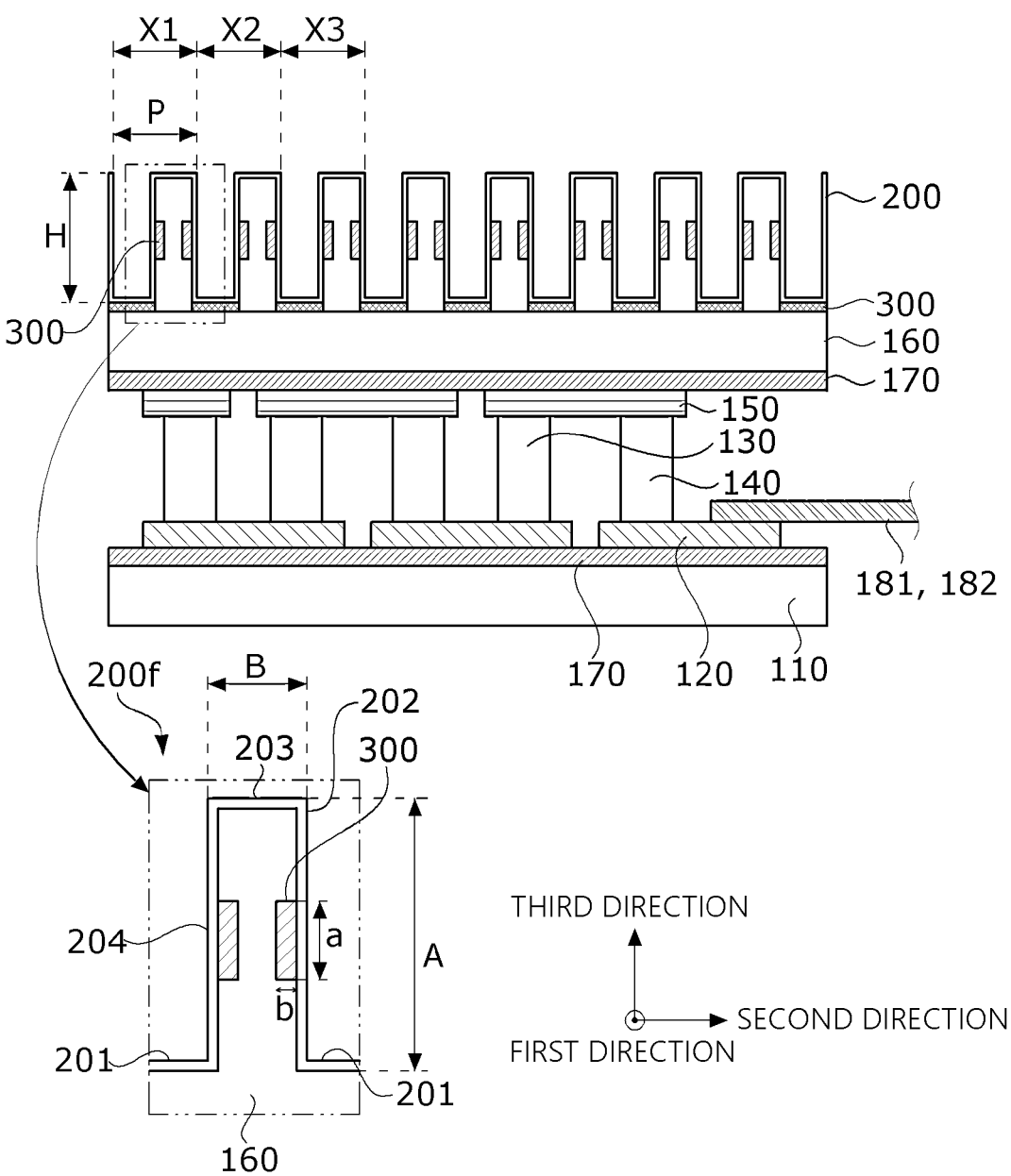
FIG. 16 is a cross-sectional view of the thermoelectric module according to one embodiment of the present invention.
Figure 17:
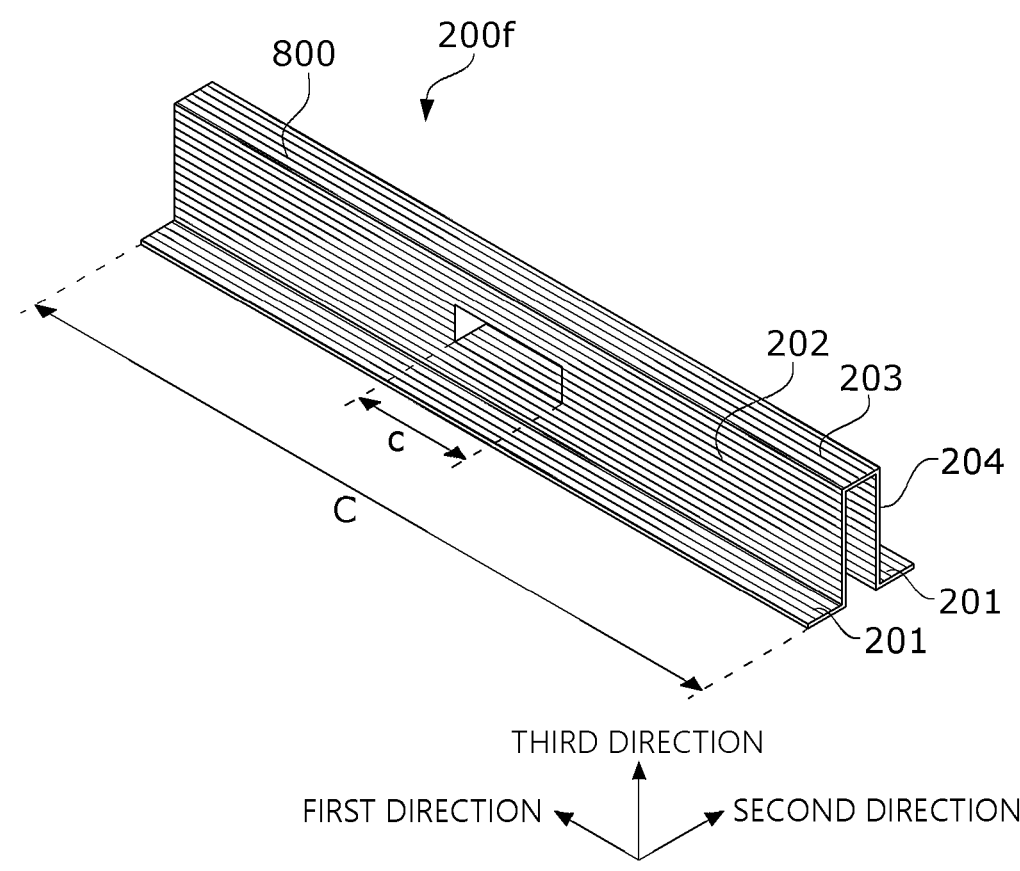
FIG. 17 is a perspective view of one fin in the heat sink included in the thermoelectric module according to one embodiment of the present invention.
Figure 18:
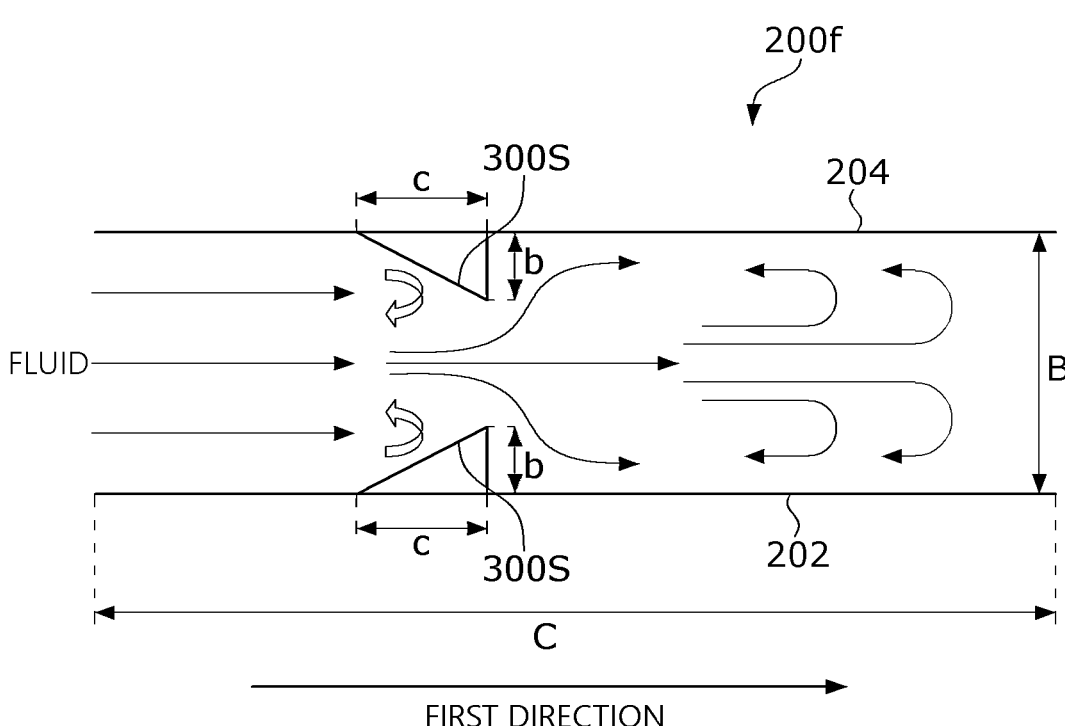
FIG. 18 is a cross-sectional view of one fin in the heat sink included in the thermoelectric module according to one embodiment of the present invention.

FIG. 16 is a cross-sectional view of the thermoelectric module according to one embodiment of the present invention, FIG. 17 is a perspective view of one fin in the heat sink included in the thermoelectric module according to one embodiment of the present invention, and FIG. 18 is a cross-sectional view of one fin in the heat sink included in the thermoelectric module according to one embodiment of the present invention. Here, since contents of a detailed structure of the thermoelectric element 100, that is, the lower substrate 110, the lower electrode 120, the P-type thermoelectric leg 130, the N-type thermoelectric leg 140, the upper electrode 150, the upper substrate 160, and the insulating layer 170 may be applied in the same manner as those described with reference to FIGS. 1 and 2, for convenience of description, overlapping descriptions thereof will be omitted.

Referring to FIGS. 16 to 18, the adhesive layer 300 is disposed on the second substrate 160, and the heat sink 200 is disposed on the adhesive layer 300. The second substrate 160 and the heat sink 200 may be bonded by the adhesive layer 300. Here, although an example in which the heat sink 200 is disposed on the upper substrate 160, that is, the second substrate 160 is described, it is for convenience of description, and the present invention is not limited thereto.

That is, the heat sink 200 having the same structure as the embodiment of the present invention may be disposed on the lower substrate 110, that is, the first substrate 110, and disposed on both the first substrate 110 and the second substrate 160.

The heat sink 200 according to the embodiment of the present invention has a shape in which a predetermined pattern is regularly repeated and connected, and each pattern extends in the direction in which the fluid passes, that is, the first direction. Contents of each pattern may be applied in the same manner as those described with reference to FIGS. 5 and 6.

The plurality of grooves 800 described with reference to FIGS. 8 to 14 may be formed in the surface of the heat sink 200 according to the embodiment of the present invention.

Meanwhile, according to the embodiment of the present invention, the heat sink 200 further includes a protrusion 300 disposed on at least one surface of a path through which the fluid passes. Therefore, when the fluid passing through the heat sink 200 meets the protrusion 300, the flow of the fluid may be changed from a laminar flow to a turbulent flow to reduce the flow rate, and the amount of heat exchange between the heat sink 200 and the fluid may be increased.

More specifically, the protrusion 300 may be disposed in each of the patterns X1, X2, and X3. Therefore, the flow rate of the fluid passing through each of the patterns X1, X2, and X3 may be uniformly controlled throughout the heat sink 200.

As described above, the first surface 201 may be disposed on the second substrate 160 and disposed to be in contact with the adhesive layer 300. The second surface 202 may be connected to the first surface 201 and disposed in a direction perpendicular to the second substrate 160. That is, the second surface 202 may extend upward from one end of the first surface 201. The third surface 203 may be connected to the second surface 202 and disposed to face the second substrate 160. In this case, a distance between the second substrate 160 and the third surface 203 may be greater than a distance between the second substrate 160 and the first surface 201. The fourth surface 204 may be connected to the third surface 203 and may be disposed perpendicular to the second substrate 160 and to face the second surface 202.

The protrusion 300 according to the embodiment of the present invention may be disposed on at least one of the first surface 201, the second surface 202, the third surface 203, and the fourth surface 204. For example, as shown in FIGS. 16 to 18, the protrusion 300 may be disposed in a region formed by the second surface 202, the third surface 203, the fourth surface 204, and the second substrate 106, and in particular, may be disposed on the second surface 202 and the fourth surface 204. Referring to FIG. 18, the fluid flowing into the region formed by the second surface 202, the third surface 203, the fourth surface 204, and the second substrate 106, that is, the fin 200f flows in the first direction in the fin 200f. When the fluid meets the protrusion 300, the flow rate of the fluid is reduced due to the generation of turbulence, and thus the amount of heat exchange between the fin 200f and the fluid may be increased. In this case, to efficiently generate turbulence, both protrusions 300 disposed on the second surface 202 and the fourth surface 204 may be disposed symmetrically.

In this case, a height a of the protrusion 300 in a direction perpendicular to the second substrate 160 may be in the range of 30 to 50% of a distance A between the second substrate 160 and the third surface 203, a thickness b of the protrusion 300 in a direction perpendicular to the direction in which the fluid passes and parallel to the second substrate

160 may be in the range of 10 to 20%, and a length c of the protrusion 300 in the direction in which the fluid passes may be in the range of 4 to 10% of a length of each of the second surface 202 and the fourth surface 204. When the protrusion 300 is greater than or equal to the lower limit of such a numerical range, turbulence may be generated inside the heat sink 200, and when the protrusion 300 is smaller than or equal to the upper limit of such a numerical range, it is possible to minimize a pressure difference between a fluid flowing into the heat sink 200 and a fluid discharged from the heat sink 200.

In this case, the protrusion 300 may be disposed to be spaced apart from the second substrate 160. Therefore, since a fluid flowing at a central height among fluids passing between the second substrate 160 and the third surface 203 generates a vortex, a vortex may also be generated in a fluid flowing at a low height along the second substrate 160 and a fluid flowing at a high height along the third surface 203.

Here, the protrusion 300 may be made of a metal material. For example, the protrusion 300 may be made of the same type of metal material as the heat sink 200. For example, the protrusion 300 may be molded integrally with the heat sink 200 as shown in FIG. 17. That is, in a case where the protrusion 300 is disposed on the second surface 202, when a recessed groove is formed in one of two surfaces of the second surface 202, the protrusion 300 may be formed on an opposite surface. Therefore, since the fluid in contact with the protrusion 300 may also exchange heat, the amount of heat exchange of the fluid may be increased.

Meanwhile, the protrusion 300 has a triangular cross-section, that is, a triangular pillar shape, and although not shown, the plurality of grooves 800 according to the embodiment of the present invention may be formed in a surface 300S of the protrusion 300. Therefore, when the fluid passes through the surface 300S of the protrusion 300, it is possible to minimize the possibility that the soot S included in the fluid is adsorbed on the surface 300S of the protrusion 300.

The power generation system may generate power through heat sources generated from vessels, vehicles, power plants, geothermal heat, or the like and include a plurality of power generation devices arranged to efficiently converge the heat sources. In this case, in each power generation device, it is possible to improve the cooling performance of the low-temperature part of the thermoelectric element by improving the bonding strength between the thermoelectric module and the fluid flow part, thereby improving the efficiency and reliability of the power generation device and thus improving the fuel efficiency of the transportation such as vessels or vehicles. Therefore, in the shipping and transportation industry, it is possible to reduce transportation costs, create an eco-friendly industry environment, and reduce material costs and the like when applied to a manufacturing industry such as a steel mill.

Although the present invention has been described above with reference to exemplary embodiments, those skilled in the art will understand that the present invention may be modified and changed variously without departing from the spirit and scope of the present invention as described in the appended claims.

The invention claimed is:

1. A thermoelectric module, comprising:
   a first substrate;
   a first electrode disposed on the first substrate;
   a semiconductor structure disposed on the first electrode;
   a second electrode disposed on the semiconductor structure;

a second substrate disposed on the second electrode; and a heat sink disposed on the second substrate, wherein a surface of the heat sink includes a plurality of grooves extending in a first direction in which a fluid passes, wherein each of the plurality of grooves has a first width in a direction parallel to the surface of the heat sink and perpendicular to the first direction and has a depth in a direction perpendicular to the surface of the heat sink, and wherein the first width is in the range of 1 to 10 μm, and the depth is in the range of 1 to 10 μm.

2. The thermoelectric module of claim 1, wherein the heat sink includes:

a first surface disposed on the second substrate;

a second surface connected to the first surface and disposed in a direction perpendicular to the second substrate;

a third surface connected to the second surface and disposed to face the second substrate; and a fourth surface connected to the third surface and disposed perpendicular to the second substrate and to face the second surface, a distance between the second substrate and the third surface is greater than a distance between the second substrate and the first surface, the first surface, the second surface, the third surface, and the fourth surface each extend in the first direction, the first surface, the second surface, the third surface, and the fourth surface are connected by being sequentially repeated multiple times, and the plurality of grooves are disposed in the first surface, the second surface, the third surface, and the fourth surface.

3. The thermoelectric module of claim 2, wherein the plurality of grooves are formed in a surface opposite to a surface facing the second substrate of both surfaces of the first surface, both surfaces of the second surface, both surfaces of the third surface, and both surfaces of the fourth surface.

4. The thermoelectric module of claim 3, wherein a second width of a wall portion disposed between two adjacent grooves among the plurality of grooves is smaller than the first width.

5. The thermoelectric module of claim 4, wherein the second width is in the range of 0.1 to 0.9 times the first width.

6. The thermoelectric module of claim 4, wherein a shortest distance between a wall portion of the second surface and a wall portion of the third surface is in the range of 1 to 10 μm in a corner region in which a surface disposed in a space formed by the second substrate, the second surface, the third surface, and the fourth surface of both surfaces of the second surface meets a surface disposed to face the second substrate of both surfaces of the third surface.

7. The thermoelectric module of claim 4, wherein a shortest distance between a wall portion of a surface disposed in a space formed by the second substrate, the second surface, the third surface, and the fourth surface of both surfaces of the second surface and the second substrate is in the range of 1 to 10 μm.

8. The thermoelectric module of claim 2, wherein at least one of the first width and the depth is in the range of 0.03 to 0.1 times a thickness of the third surface.

9. The thermoelectric module of claim 1, wherein the first width is greater than or equal to the depth.

10. The thermoelectric module of claim 4, wherein the second width is in a range of 0.01 to 0.1 times a thickness of the third surface.

11. The thermoelectric module of claim 1, further comprising a plurality of intersecting grooves extending in a direction intersecting a direction in which the plurality of grooves extend in the surface of the heat sink.

12. The thermoelectric module of claim 4, wherein a region in which a bottom surface of the groove meets a side surface of the wall portion has a rounded shape.

13. The thermoelectric module of claim 1, wherein the heat sink further includes a protrusion disposed on at least one surface on a path through which the fluid passes.

14. The thermoelectric module of claim 2, wherein the first surface is disposed in contact with the second substrate by an adhesive layer.

15. A power generator, comprising:

a cooling part; and a thermoelectric module disposed on the cooling part, wherein the thermoelectric module includes:

a first substrate;

a first electrode disposed on the first substrate;

a semiconductor structure disposed on the first electrode;

a second electrode disposed on the semiconductor structure;

a second substrate disposed on the second electrode; and a heat sink disposed on the second substrate, wherein a surface of the heat sink includes a plurality of grooves extending in a first direction in which a fluid passes, wherein each of the plurality of grooves has a first width in a direction parallel to the surface of the heat sink and perpendicular to the first direction and has a depth in a direction perpendicular to the surface of the heat sink, and wherein the first width is in the range of 1 to 10 μm, and the depth is in the range of 1 to 10 μm.

16. The power generator of claim 15, wherein the heat sink includes:

a first surface disposed on the second substrate;

a second surface connected to the first surface and disposed in a direction perpendicular to the second substrate;

a third surface connected to the second surface and disposed to face the second substrate; and a fourth surface connected to the third surface and disposed perpendicular to the second substrate and to face the second surface, a distance between the second substrate and the third surface is greater than a distance between the second substrate and the first surface, the first surface, the second surface, the third surface, and the fourth surface each extend in the first direction, the first surface, the second surface, the third surface, and the fourth surface are connected by being sequentially repeated multiple times, and the plurality of grooves are disposed in the first surface, the second surface, the third surface, and the fourth surface.

17. The power generator of claim 16, wherein the plurality of grooves are formed in a surface opposite to a surface facing the second substrate of both surfaces of the first surface, both surfaces of the second surface, both surfaces of the third surface, and both surfaces of the fourth surface.

18. The power generator of claim 17, wherein a second width of a wall portion disposed between two adjacent grooves among the plurality of grooves is smaller than the first width.

19. The power generator of claim 18, wherein the second width is in the range of 0.1 to 0.9 times the first width.

20. The thermoelectric module of claim 18, wherein a shortest distance between a wall portion of the second surface and a wall portion of the third surface is in the range of 1 to 10 μm in a corner region in which a surface disposed in a space formed by the second substrate, the second surface, the third surface, and the fourth surface of both surfaces of the second surface meets a surface disposed to face the second substrate of both surfaces of the third surface.

* * * * *